US009515248B2

(12) United States Patent
Moon et al.

(10) Patent No.: US 9,515,248 B2
(45) Date of Patent: Dec. 6, 2016

(54) VIBRATION GENERATING APPARATUS

(71) Applicant: SAMSUNG ELECTRO-MECHANICS CO., LTD., Suwon-Si (KR)

(72) Inventors: Dong Su Moon, Suwon-Si (KR); Kyung Su Park, Suwon-Si (KR); Sang Jin Lee, Suwon-Si (KR); Jae Kyung Kim, Suwon-Si (KR); Joon Choi, Suwon-Si (KR); Yeon Ho Son, Suwon-Si (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 184 days.

(21) Appl. No.: 14/447,222

(22) Filed: Jul. 30, 2014

(65) Prior Publication Data
US 2015/0236241 A1 Aug. 20, 2015

(30) Foreign Application Priority Data

Feb. 17, 2014 (KR) .................. 10-2014-0017925

(51) Int. Cl.
| H01L 41/08 | (2006.01) |
| H01L 41/09 | (2006.01) |
| H01L 41/053 | (2006.01) |
| B06B 1/12 | (2006.01) |

(52) U.S. Cl.
CPC ............. *H01L 41/0933* (2013.01); *B06B 1/12* (2013.01); *H01L 41/053* (2013.01)

(58) Field of Classification Search
CPC .................. H01L 41/0933; H01L 41/1134
USPC ............................ 310/328, 324, 326
See application file for complete search history.

(56) References Cited

U.S. PATENT DOCUMENTS

| 2012/0056826 A1 | 3/2012 | Kim et al. |
| 2012/0212100 A1 | 8/2012 | Lee |
| 2012/0248935 A1* | 10/2012 | Liu ..................... H01L 41/0933 |
| | | 310/326 |
| 2013/0106239 A1 | 5/2013 | Yun et al. |
| 2013/0300257 A1* | 11/2013 | Kim ..................... H01L 41/0533 |
| | | 310/326 |

FOREIGN PATENT DOCUMENTS

| KR | 10-2010-0043770 | 4/2010 |
| KR | 10-2011-0045486 A | 5/2011 |
| KR | 10-2012-0025684 | 3/2012 |
| KR | 10-2012-0126597 A | 11/2012 |
| KR | 10-2013-0037286 | 4/2013 |
| KR | 10-2013-0047604 | 5/2013 |
| KR | 10-2013-0125172 | 11/2013 |

OTHER PUBLICATIONS

Office Action dated Aug. 17, 2015 for Korean Patent Application No. 10-2014-0017925 and its English summary provided by Applicant's foreign counsel.

* cited by examiner

*Primary Examiner* — J. San Martin
(74) *Attorney, Agent, or Firm* — LRK Patent Law Firm

(57) ABSTRACT

There is provided a vibration generating apparatus including: an elastic member having both end portions thereof fixedly installed on a support part of a lower case; a piezoelectric element installed on one surface of the elastic member; and a mass body part connected to the elastic member to increase an amount of vibrations, wherein the mass body part is provided with protrusion portions for first contacting the lower case at the time of an external impact.

13 Claims, 9 Drawing Sheets

VIBRATION GENERATING APPARATUS

CROSS-REFERENCE TO RELATED APPLICATION

This application claims the benefit of Korean Patent Application No. 10-2014-0017925 filed on 17 Feb. 2014, with the Korean Intellectual Property Office, the disclosure of which is incorporated in its entirety herein by reference.

BACKGROUND

The present disclosure relates to a vibration generating apparatus.

Such a vibration generating apparatus, converting electrical energy into mechanical vibrations using the principle of the generation of electromagnetic force, has commonly been mounted in mobile phones, and the like, to thereby be used for silently notifying a user of call reception by transferring vibrations thereto. In addition, in accordance with the rapid growth in the market for mobile devices such as the mobile phone, and the like, and the trend for the addition of added functionality to mobile devices, the mobile devices have been required to be relatively small in terms of size while having high quality. In this situation, the demand for the development of a vibration generating apparatus having a novel structure capable of overcoming the disadvantages of existing vibration generating apparatuses and having significantly improved quality has increased.

Further, as the release of smartphones, among mobile phones, has rapidly increased, a touchscreen user interface scheme has been adopted for use therein, such that a vibration motor has been used in order to generate vibrations at the time of a touch interaction with a touchscreen. Levels of performance required in the vibrations generated at the time of a touch interaction with such a touchscreen are as follows. First, since the amount of vibrations generated by a vibration generation apparatus is greater in the case of vibrations generated in response to a touch interaction with a touchscreen than in the case of vibrations generated at the time of call reception, the operational lifespan of a vibration generation apparatus should be extended. Second, in order to raise user's satisfaction when a user feels the vibrations at the time of touching the touchscreen, a response speed of the vibrations should increase in accordance with a touch speed of the touchscreen.

A piezo haptic actuator has been used as a product capable of implementing such features. Such a piezo haptic actuator uses the principle of an inverse piezoelectric effect in which displacement is generated when a voltage is applied to a piezo element, that is, a principle of allowing the weight of a mass body to be moved by the generated displacement to generate vibrational force.

A vibrator having the above-mentioned structure has the following features. A bandwidth of a frequency capable of obtaining a predetermined level of vibrational force or more is wide, such that stable vibration characteristics may be implemented, and vibrations having high and low frequencies, rather than a single frequency, within a predetermined frequency range may be variously used. In addition, since the vibrator may implement rapid operation response characteristics, it may be appropriate for implementing haptic vibrations in a mobile device such as a mobile phone, or the like.

However, the piezo element may be easily damaged due to external impacts. In other words, in the case in which the piezo element is disposed on a lower surface of an elastic plate of the mass body, the piezo element may be easily damaged due to a contact between the piezo element and a lower case when an external impact is applied to the vibrator.

RELATED ART DOCUMENT (Patent Document 1) Korea Patent Laid-Open Publication No. 2011-45486

SUMMARY

An aspect of the present disclosure may provide a vibration generating apparatus capable of decreasing damage to a piezoelectric element.

According to an aspect of the present disclosure, a vibration generating apparatus may include: an elastic member having both end portions thereof fixedly installed on a support part of a lower case; a piezoelectric element installed on one surface of the elastic member; and a mass body part connected to the elastic member to increase an amount of vibrations, wherein the mass body part is provided with protrusion portions for first contacting the lower case at the time of an external impact.

The mass body part may include a mass body case connected to the piezoelectric element through an adhesive member and a mass body installed in the mass body case, and the protrusion portions may be provided on the mass body case.

The protrusion portions may be extended downwardly from both side surfaces of the mass body case, respectively, and be disposed at a central portion of the mass body case in a length direction thereof.

The protrusion portions may be extended downwardly from both side surfaces of the mass body case, respectively, and be disposed so as to be provided adjacently to both end portions thereof of the mass body case in a length direction thereof, respectively.

Distal ends of the protrusion portions may be disposed below a damper member installed on a lower surface of the elastic member.

The adhesive member may be formed of a soft material.

The adhesive member may be formed of tape containing a rubber component.

The protrusion portion may have a polygonal shape when viewed from a front.

The protrusion portions may include first and second protrusions disposed so as to be spaced apart from a center line of the mass body case by a predetermined interval and third and fourth protrusions disposed so as to be spaced apart from the first and second protrusions, respectively, in a length direction.

The third and fourth protrusions may be disposed at both end portions thereof of the mass body case, respectively.

The first and second protrusions may have sizes larger than those of the third and fourth protrusions.

The mass body case may be provided with a groove into which the piezoelectric element is inserted.

The mass body case may be provided with bonding protrusions for increasing coupling force between the mass body case and the mass body, and the mass body may be provided with bonding grooves into which the bonding protrusions are inserted.

According to another aspect of the present disclosure, a vibration generating apparatus may include: an elastic member having both end portions thereof fixedly installed on a support part of a lower case; a piezoelectric element installed on one surface of the elastic member; a mass body case connected to the piezoelectric element through an adhesive member; and a mass body installed in the mass body case, wherein the mass body case is provided with protrusion portions extended downwardly from both side surfaces of the mass body case, respectively.

Distal ends of the protrusion portions may be disposed below a damper member installed on a lower surface of the elastic member.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
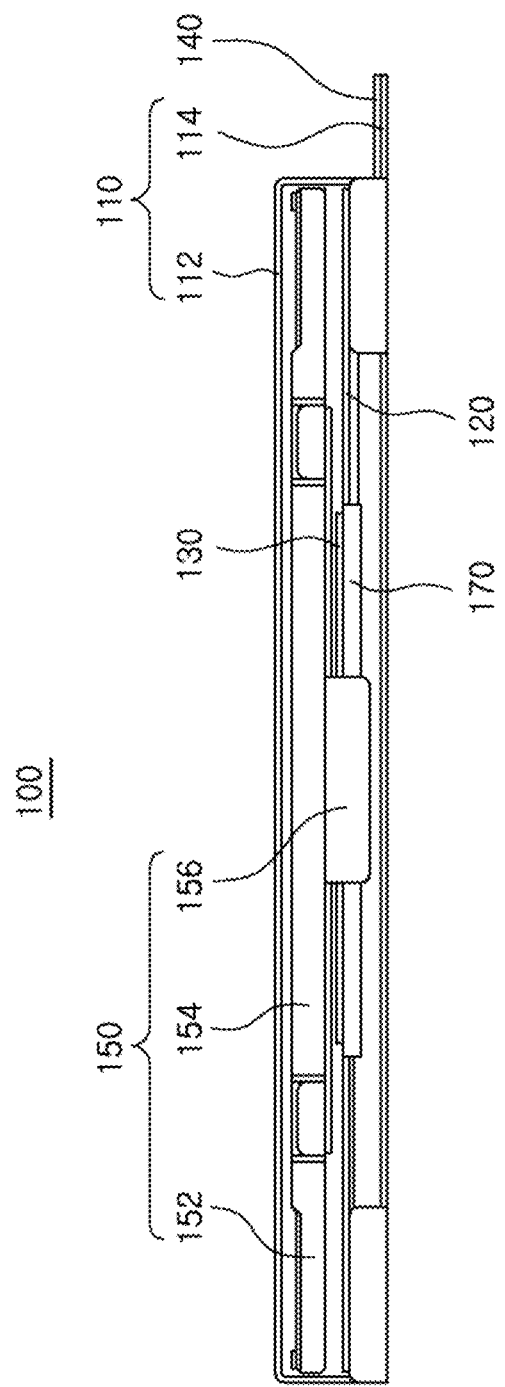
FIG. 1 is a schematic cross-sectional view illustrating a vibration generating apparatus according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
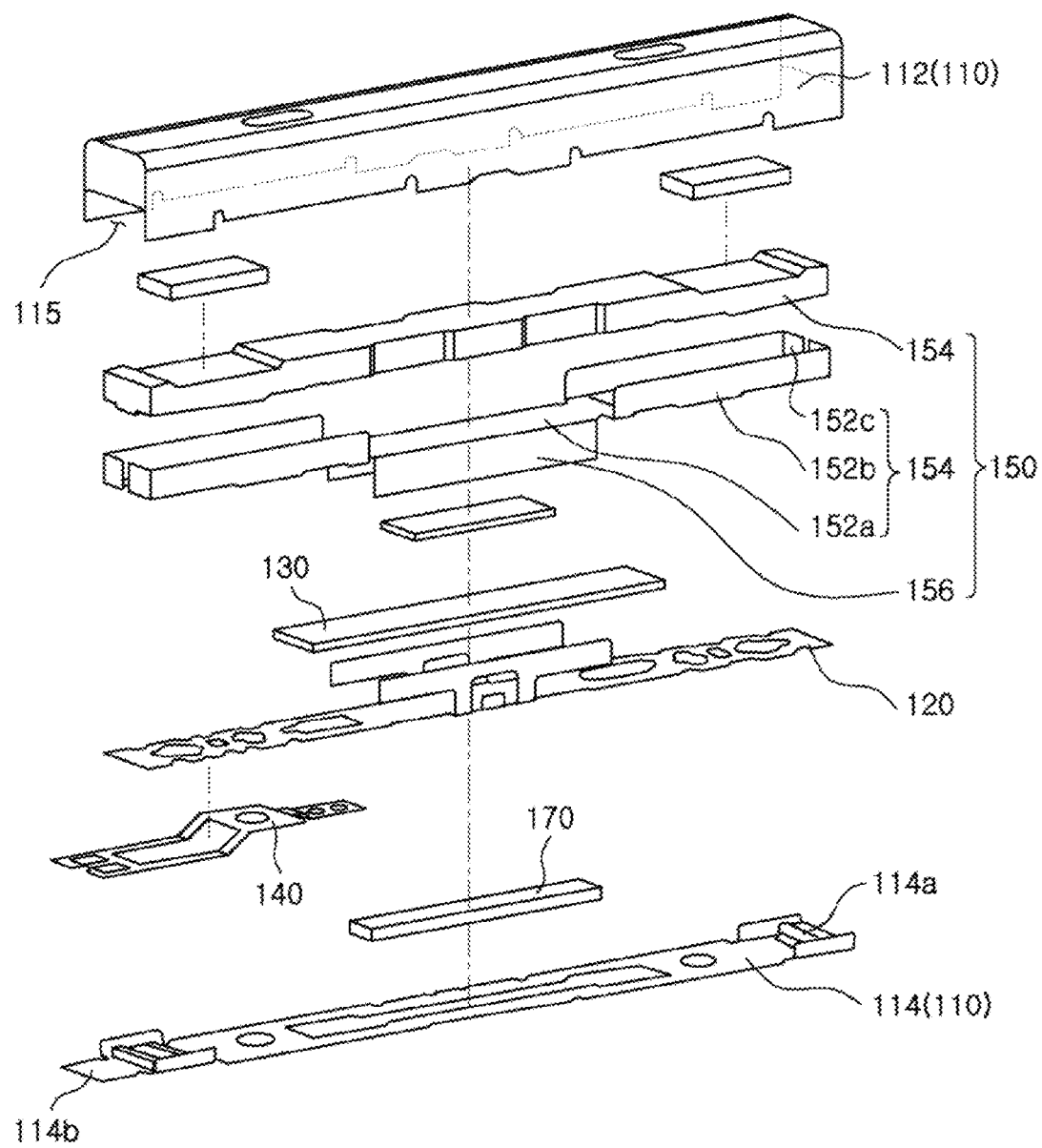
FIG. 2 is an exploded perspective view illustrating the vibration generating apparatus according to an exemplary embodiment of the present disclosure.

FIG. 1 is a schematic cross-sectional view illustrating a vibration generating apparatus according to an exemplary embodiment of the present disclosure; FIG. 2 is an exploded perspective view illustrating the vibration generating apparatus according to an exemplary embodiment of the present disclosure; and FIG. 3 is a schematic perspective view illustrating a mass body part included in the vibration generating apparatus according to an exemplary embodiment of the present disclosure.

Figure 3:
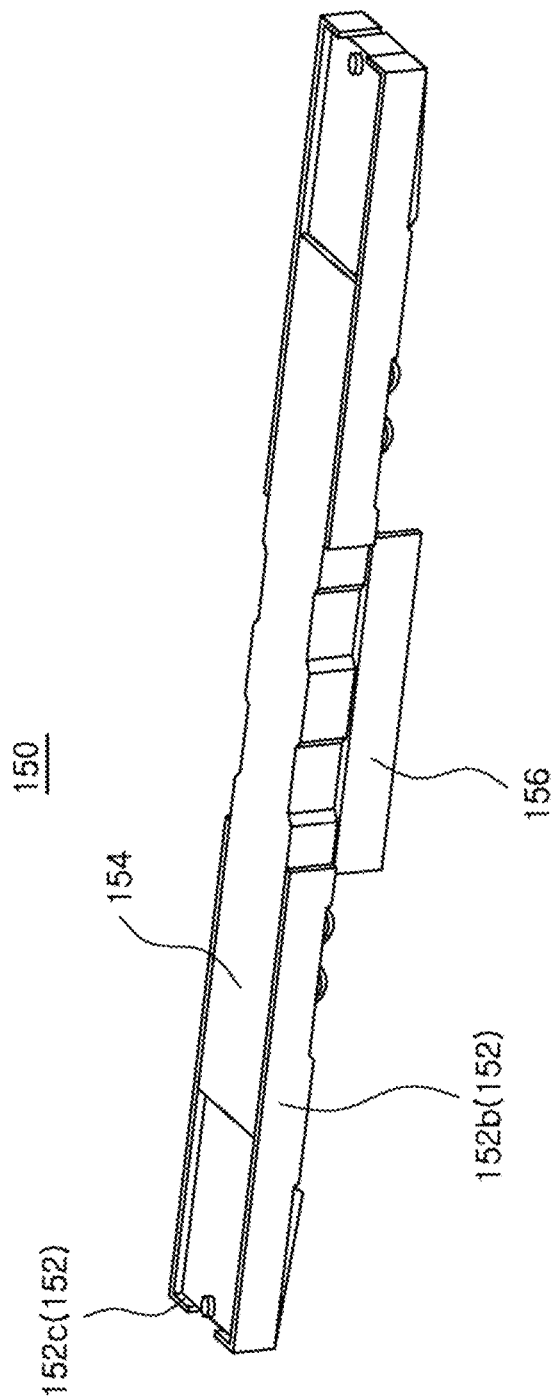
FIG. 3 is a schematic perspective view illustrating a mass body part included in the vibration generating apparatus according to an exemplary embodiment of the present disclosure.

Referring to FIGS. 1 through 3, a vibration generating apparatus 100 according to an exemplary embodiment of the present disclosure may include a housing 110, an elastic member 120, a piezoelectric element 130, a circuit board 140, and a mass body part 150 by way of example.

The housing 110 may have a rectangular parallelepiped shape and include an upper case 112 and a lower case 114. In addition, as an example, the upper case 112 may have a box shape having an internal space, and the lower case 114 may have a plate shape.

Meanwhile, the upper case 112 may have the box shape of which a lower portion is opened, and the lower case 114 having the plate shape may be assembled to a lower end portion of the upper case 112.

In addition, the upper case 112 may have a groove in at least one of both end surfaces thereof in order to withdraw the circuit board 140. That is, one end portion of the circuit board 140 may be withdrawn through the groove 115 formed in the upper case 112 when the upper case 112 and the lower case 114 are assembled to each other.

The lower case 114 may have support parts 114*a* formed thereon in order to support both end portions thereof of the elastic member 120. As an example, the support parts 114*a* may be formed by denting and may have a rectangular pillar shape.

In addition, the lower case 114 may have an extension plate 114*b* formed at one of both end portions thereof, wherein the extension plate 114*b* is extended so as to protrude from the upper case 112 in a length direction. The extension plate 114*b* may provide a seating surface on which the withdrawn portion of the circuit board 140 is seated at the time of withdrawing the circuit board 140.

The elastic member 120 may have both end portions thereof fixedly installed on the housing 110. Therefore, the elastic member 120 may have fixed ends formed at both end portions thereof. Although the case in which the elastic member 120 is fixedly installed on the lowercase 120 has been described by way of example in the present exemplary embodiment, the present disclosure is not limited thereto. That is, the elastic member 120 may be fixedly installed on the upper case 112.

Meanwhile, the elastic member 120 may have an opening part 122 formed therein in order to electrically connect the piezoelectric element 130 and the circuit board 140 to each other. The opening part 122 may be formed in the elastic member 120 so that one end portion of a lower surface of the piezoelectric device 130 may be exposed at the time of installing the piezoelectric element 130.

That is, one end portion of the lower surface of the piezoelectric element 130 may be exposed toward a lower portion of the elastic member 120 by the opening part 122.

In addition, the opening part 122 may have, for example, a rectangular shape when viewed from the top. However, a shape of the opening part 122 is not limited thereto, but may be variously changed.

The piezoelectric element 130 may be installed on the elastic member 120 so as to face the mass body part 150. As an example, the piezoelectric element 130 may be fixedly installed on an upper surface of the elastic member 120. In addition, the piezoelectric element 130 may have a plate shape with a rectangular parallelepiped shape, and may include at least one pair of external electrodes (not shown) formed on the lower surface thereof. The external electrodes 132 may be positive (+) and negative (−) electrodes.

The circuit board 140 may be installed beneath the elastic member 120 so as to be connected to the piezoelectric element 130. That is, the circuit board 140 may be installed on a lower surface of the elastic member 120. In addition, the circuit board 140 may have a connection electrode 142 formed thereon, wherein the connection electrode 142 is inserted into the opening part 122 formed in the elastic member 120.

Meanwhile, the circuit board 140 may be a flexible printed circuit board.

The mass body part 150 may be disposed above the piezoelectric element 130 to increase an amount of vibrations of the elastic member 120. Meanwhile, the mass body part 150 may include amass body case 152 connected to the piezoelectric element 130 through an adhesive member 160 and a mass body 154 installed in the mass body case 152.

The mass body case 152 may have the mass body 154 inserted thereinto and have a lower surface connected to the piezoelectric element 130 through the adhesive member 160.

Further, the mass body case 152 may be provided with protrusion portions 156. The mass body case 152 will be described in more detail. The mass body case 152 may include a bottom plate 152a supporting a lower surface of the mass body 154, side plates 152b extended upwardly from the bottom plate 152a and supporting both side surfaces of the mass body 154, respectively, and extension plates 152c extended from the side plates 152b, respectively, in a width direction and supporting both end surfaces of the mass body 154, respectively.

Meanwhile, here, terms with respect to directions will be defined. In FIG. 2, a length direction refers to an X direction, and a width direction refers to a Y direction. In addition, a height direction refers to a Z direction. Further, the terms defined above will be used below as the same meaning as the above-mentioned meaning. That is, the above-mentioned terms with respect to the respective components will indicate the same directions as the above-mentioned directions.

In addition, side surfaces refer to two surfaces of the mass body 154 opposing each other in the width direction, in other words, surfaces having width areas, and end surfaces refer to two surfaces of the mass body 150 opposing each other in the length direction, in other words, distal end surfaces having areas narrower than those of the side surfaces.

In addition, the protrusion portions 156 provided on the mass body case 152 may be extended downwardly from the bottom plate 152a. Further, the protrusion portions 156 may be extended from a central portion of the bottom plate 152a in the length direction thereof.

In addition, distal end portions of the protrusion portions 156 may be disposed below a damper member 170 installed on the lower surface of the elastic member 120 in order for the protrusion portions 156 to first contact the lower case before the elastic member 120 contacts the lower case at the time of an external impact to allow external force not to be transferred to the piezoelectric element 130.

In addition, the protrusion portion 156 may have a polygonal shape when viewed from the front. As an example, the protrusion portion 156 may have a rectangular shape as shown in the accompanying drawings. However, the protrusion portion 156 is not limited to having the above-mentioned shape. That is, a shape of a lower surface of the protrusion portion 156 may be changed into various shapes such as a wave shape, a rhombic shape, a sharp shape, a round shape, and the like.

Further, the lower case 114 contacting the lower surface of the protrusion portion 156 at the time of an external impact may also be provided with a component capable of alleviating the impact, such as a poron, a spring, an adhesive, or the like.

Meanwhile, the adhesive member 160 connecting the mass body case 152 and the piezoelectric element 130 to each other may be formed of a soft material, for example, tape containing a rubber component.

In addition, the mass body 154 may be formed of a material having a specific gravity, for example, tungsten, may serve to amplify an amount of vibrations generated by deformation of the piezoelectric element 130. Further, the mass body 154 may have a shape corresponding to that of the mass body case 152 so as to be installed in the mass body case 152.

Meanwhile, shapes of the mass body case 152 and the mass body 154 are not limited to shapes shown in the accompanying drawings, but may be variously changed.

In addition, although the case in which the protrusion portion 156 is formed in the mass body case 152 has been described by way of example in the present exemplary embodiment, the present disclosure is not limited thereto. That is, the protrusion portion 156 may be formed in the mass body 154 and may protrude downwardly of the mass body case 152.

As an example, in the case in which the mass body case 152 is omitted, the mass body 154 may be directly connected to the piezoelectric element 130 through the adhesive member 160. In this case, the protrusion portion 156 may be extended downwardly from a central portion of the mass body 154.

As another example, in the case in which the mass body case 152 is not omitted, the protrusion portion 156 may also be extended from the mass body 154.

As described above, since the protrusion portions 156 are provided on the mass body case 152, a load transferred to the mass body part 150 including the mass body case 152 at the time of the external impact is not transferred to the elastic member 120 and the piezoelectric element 130, but is directly transferred to the housing 110 by the protrusion portions 156, whereby damage to the piezoelectric element 130 may be decreased.

In other words, the mass body case 152 and the piezoelectric element 130 may be connected to each other through the adhesive member 160 formed of a soft material. Therefore, in the case in which abnormal displacement occurs at the time of the external impact, the load may be directly transferred to the mass body case 152 and be then transferred again to the housing 110, thereby decreasing that the load due to the external impact is transferred to the piezoelectric element 130 and the elastic member 120.

That is, the mass body part 150 and the piezoelectric element 130 may be separately moved by the load due to the external impact, thereby decreasing that the load transferred to the mass body part 150 is transferred to the piezoelectric element 130.

As a result, the damage to the piezoelectric element 130 due to the external impact may be decreased.

Hereinafter, a vibration generating apparatus according to another exemplary embodiment of the present disclosure will be described with reference to the accompanying drawings. However, components the same as the above-mentioned components will be denoted by the same reference numerals as the reference numerals used in the above description, and a detailed description thereof will be omitted.

Figure 4:
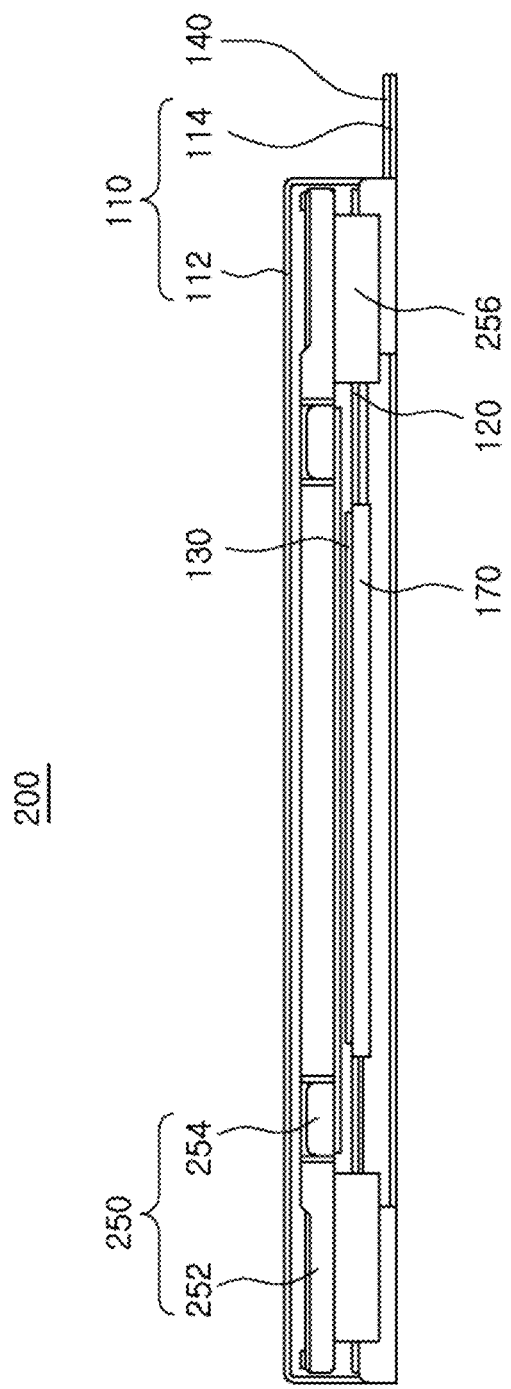
FIG. 4 is a schematic cross-sectional view illustrating a vibration generating apparatus according to another exemplary embodiment of the present disclosure.
Figure 5:
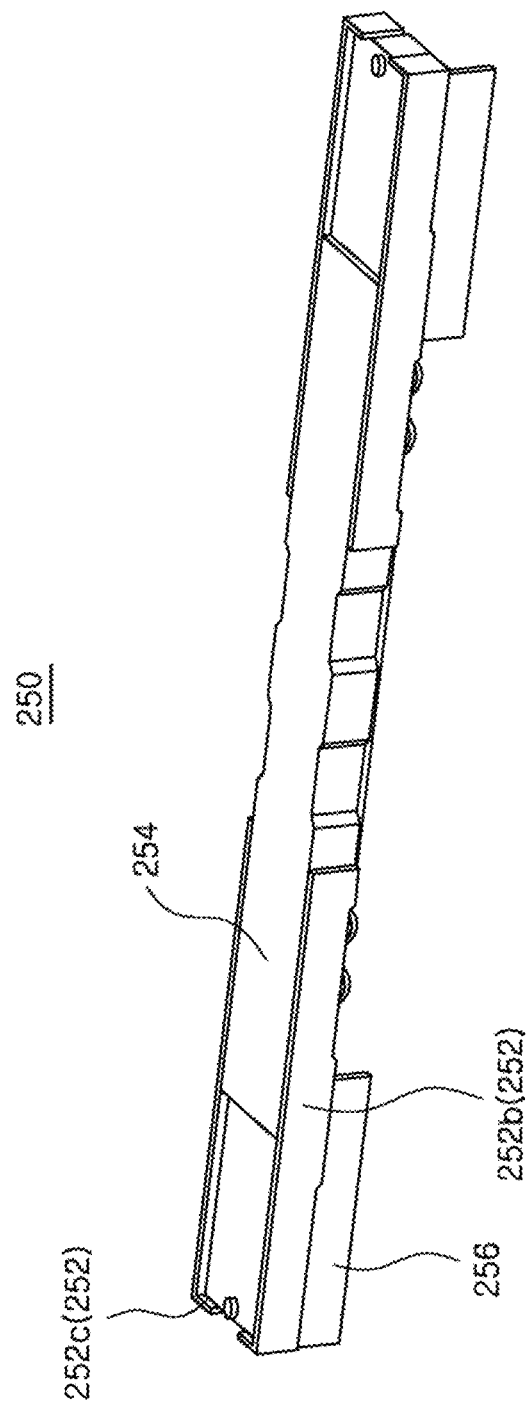
FIG. 5 is a schematic perspective view illustrating a mass body part included in the vibration generating apparatus according to another exemplary embodiment of the present disclosure.

FIG. 4 is a schematic cross-sectional view illustrating a vibration generating apparatus according to another exemplary embodiment of the present disclosure; and FIG. 5 is a schematic perspective view illustrating a mass body part included in the vibration generating apparatus according to another exemplary embodiment of the present disclosure.

Referring to FIGS. 4 and 5, a vibration generating apparatus 200 according to another exemplary embodiment of the present disclosure may include a housing 110, an elastic member 120, a piezoelectric element 130, a circuit board 140, and a mass body part 250 by way of example.

Meanwhile, since the housing 110, the elastic member 120, the piezoelectric element 130, and the circuit board 140 are the same as the housing 110, the elastic member 120, the piezoelectric element 130, and the circuit board 140 of the vibration generating apparatus 100 according to an exemplary embodiment of the present disclosure described above, respectively, a detailed description thereof will be omitted and replaced by the above description.

The mass body part 250 may be disposed above the piezoelectric element 130 to increase an amount of vibrations of the elastic member 120. Meanwhile, the mass body part 250 may include amass body case 252 connected to the piezoelectric element 130 through an adhesive member 160 and a mass body 254 installed in the mass body case 252.

The mass body case 252 may have the mass body 254 inserted thereinto and have a lower surface connected to the piezoelectric element 130 through the adhesive member 160.

Further, the mass body case 252 may be provided with protrusion portions 256. The mass body case 252 will be described in more detail. The mass body case 252 may include a bottom plate 252a supporting a lower surface of the mass body 254, side plates 252b extended upwardly from the bottom plate 252a and supporting both side surfaces of the mass body 254, respectively, and extension plates 252c extended from the side plates 252b, respectively, in a width direction and supporting both end surfaces of the mass body 254, respectively.

In addition, the protrusion portions 256 provided on the mass body case 252 may be extended downwardly from the bottom plate 252a. Further, the protrusion portions 256 may be extended so as to be provided adjacently to both end portions thereof of the bottom plate 252a, respectively.

In addition, distal end portions of the protrusion portions 256 may be disposed below a damper member 170 installed on the lower surface of the elastic member 120 in order for the protrusion portions 256 to contact the lower case before the elastic member 120 contacts the lower case at the time of an external impact to allow external force not to be transferred to the piezoelectric element 130.

In addition, the protrusion portion 256 may have a polygonal shape when viewed from the front. As an example, the protrusion portion 256 may have a rectangular shape as shown in the accompanying drawings. However, the protrusion portion 256 is not limited to having the above-mentioned shape. That is, a shape of a lower surface of the protrusion portion 256 may be changed into various shapes such as a wave shape, a rhombic shape, a sharp shape, a round shape, and the like.

Further, the lower case 114 contacting the lower surface of the protrusion portion 256 at the time of an external impact may also be provided with a component capable of alleviating the impact, such as a poron, a spring, an adhesive, or the like.

Meanwhile, the adhesive member 160 connecting the mass body case 252 and the piezoelectric element 130 to each other may be formed of a soft material, for example, tape containing a rubber component.

In addition, the mass body 254 may be formed of a material having a specific gravity, for example, tungsten, may serve to amplify an amount of vibrations generated by deformation of the piezoelectric element 130. Further, the mass body 254 may have a shape corresponding to that of the mass body case 252 so as to be installed in the mass body case 252.

Meanwhile, shapes of the mass body case 252 and the mass body 254 are not limited to shapes shown in the accompanying drawings, but may be variously changed.

As described above, since the protrusion portions 256 are provided on the mass body case 252, a load transferred to the mass body part 250 including the mass body case 252 at the time of the external impact is not transferred to the elastic member 120 and the piezoelectric element 130, but is directly transferred to the housing 110 by the protrusion portions 256, whereby damage to the piezoelectric element 130 may be decreased.

In other words, the mass body case 252 and the piezoelectric element 130 may be connected to each other through the adhesive member 160 formed of a soft material. Therefore, in the case in which abnormal displacement occurs at the time of the external impact, the load may be directly transferred to the mass body case 252 and then transmitted to the housing 110, thereby decreasing the amount of load due to the external impact being transferred to the piezoelectric element 130 and the elastic member 120.

That is, the mass body part 250 and the piezoelectric element 130 may be separately moved by the load due to the external impact, thereby decreasing the load transferred to the mass body part 250 being transferred to the piezoelectric element 130.

As a result, the damage to the piezoelectric element 130 due to the external impact may be decreased.

Meanwhile, although the case in which the protrusion portions 256 provided in the mass body part 250 are formed at both sides, respectively, so as to be provided adjacently to both end portions thereof, respectively, in the vibration generating apparatus 200 according to another exemplary embodiment of the present disclosure has been described by way of example, the present disclosure is not limited thereto. That is, the protrusion portions 256 may also be formed at all of both sides and a central portion.

Hereinafter, modified examples of the mass body part will be described with reference to the accompanying drawings.

Figure 6:
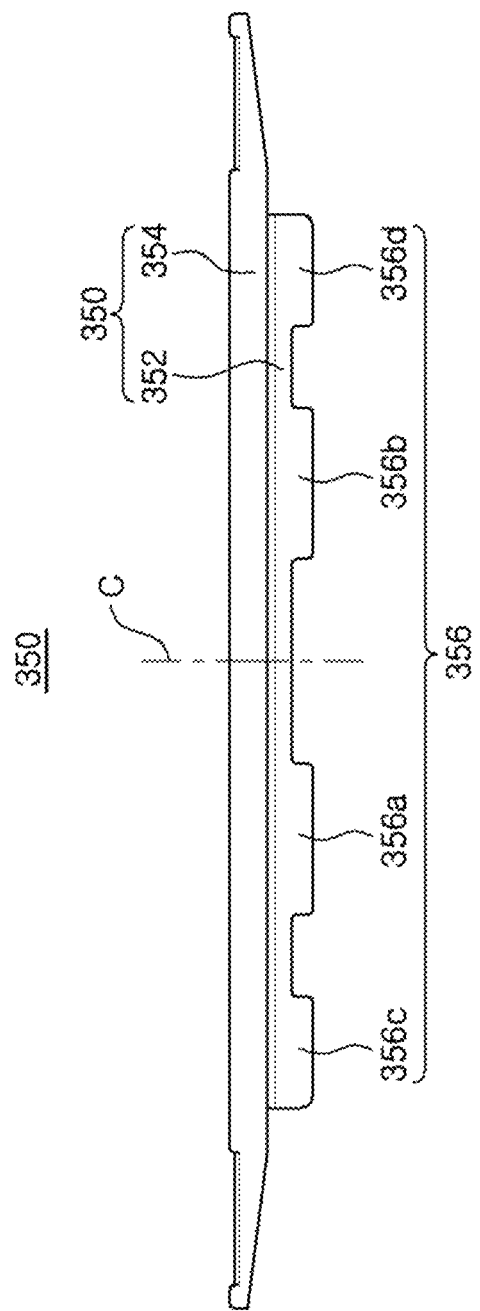
FIG. 6 is a front view illustrating a first modified example of the mass body.
Figure 7:
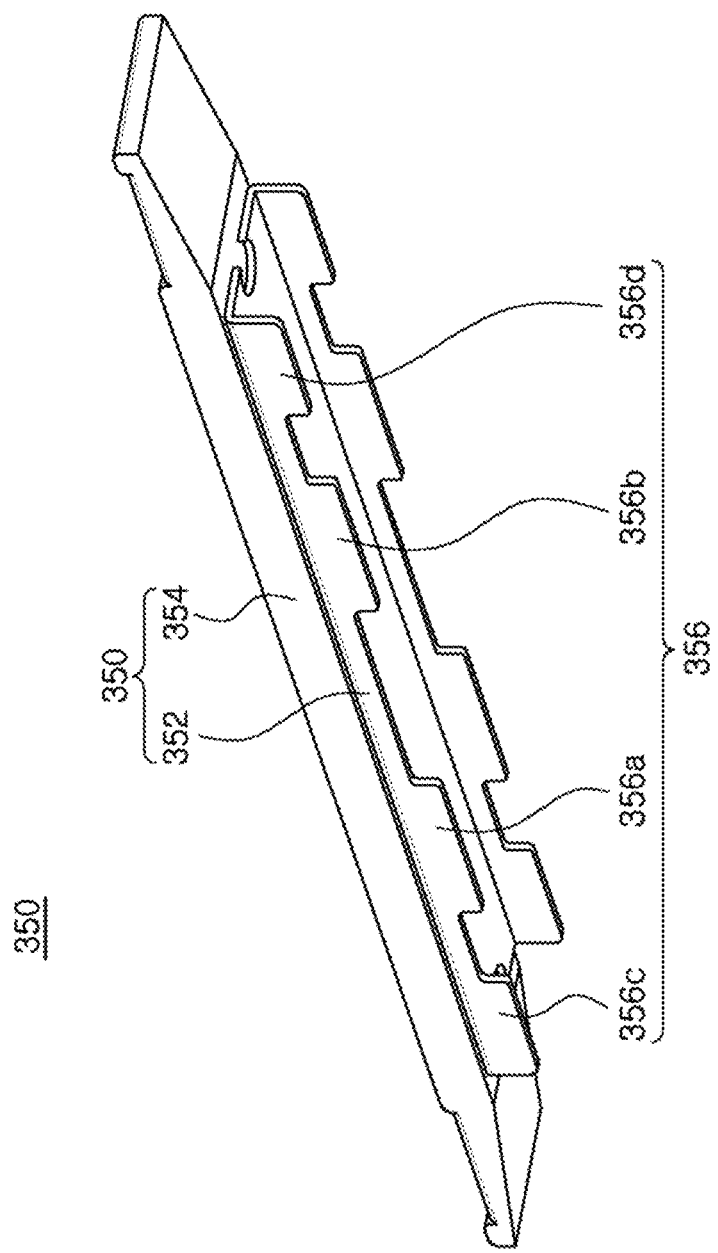
FIG. 7 is a bottom perspective view illustrating the first modified example of the mass body.

FIG. 6 is a front view illustrating a first modified example of the mass body; and FIG. 7 is a bottom perspective view illustrating the first modified example of the mass body.

Referring to FIGS. 6 and 7, the mass body part 350 may include a mass body case 352 and a mass body 354 adhered to and installed on an upper surface of the mass body case 352.

Meanwhile, the mass body case 352 may be provided with protrusion portions 356. The protrusion portions 356 may be formed so as to be symmetrical to each other based on a center line C and may be extended downwardly.

In addition, the protrusion portions 356 may include first and second protrusions 356a and 356b disposed so as to be spaced apart from the center line C by a predetermined interval in the length direction and third and fourth protrusions 356c and 356d disposed so as to be spaced apart from the first and second protrusions 356a and 356b, respectively, by a predetermined interval in the length direction.

In addition, sizes of the first and second protrusions 356a and 356b may be larger than those of the third and fourth protrusions 356c and 356d.

Meanwhile, the protrusion portions 356 may be provided at both side surfaces of the mass body case 352, respectively.

In addition, the mass body case 352 may be provided with a groove into which the piezoelectric element 130 (See FIG. 2) is inserted.

Figure 8:
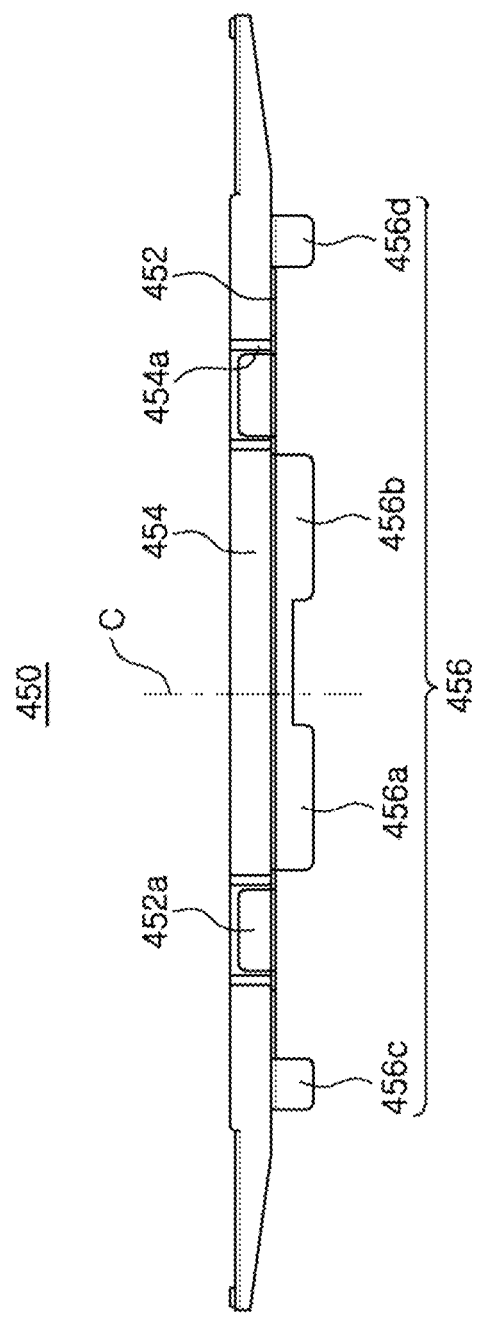
FIG. 8 is a front view illustrating a second modified example of the mass body.
Figure 9:
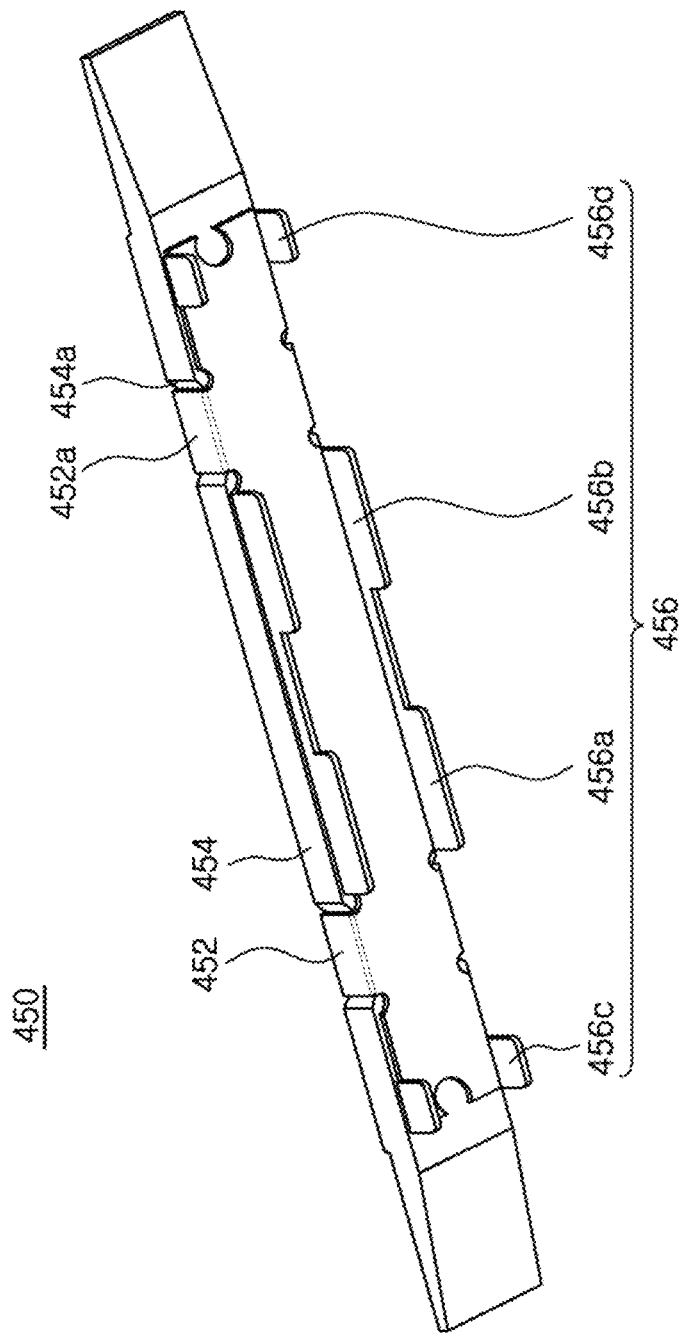
FIG. 9 is a bottom perspective view illustrating a third modified example of the mass body.

FIG. 8 is a front view illustrating a second modified example of the mass body; and FIG. 9 is a bottom perspective view illustrating the third modified example of the mass body.

Referring to FIGS. 8 and 9, the mass body part 450 may include a mass body case 452 and a mass body 454 assembled to the mass body case 452.

Meanwhile, the mass body case 452 may be provided with protrusion portions 456. The protrusion portions 456 may be formed so as to be symmetrical to each other based on a center line C and may be extended downwardly.

In addition, the protrusion portions 456 may include first and second protrusions 456a and 456b disposed so as to be spaced apart from the center line C by a predetermined interval in the length direction and third and fourth protrusions 456c and 456d disposed at both end portions thereof.

In addition, sizes of the first and second protrusions 456a and 456b may be larger than those of the third and fourth protrusions 456c and 456d.

Further, the mass body case 452 may be provided with bonding protrusions 452a for increasing coupling force between the mass body case 452 and the mass body 454. The bonding protrusions 452a may be inserted into bonding grooves 454a formed in the mass body 454.

Meanwhile, the protrusion portions 456 may be provided at both side surfaces of the mass body case 452, respectively.

In addition, the mass body case 452 may be provided with a groove into which the piezoelectric element 130 (See FIG. 2) is inserted.

As set forth above, according to exemplary embodiments of the present disclosure, the mass body part may first contact a lower bracket, whereby damage to the piezoelectric element may be decreased.

While exemplary embodiments have been shown and described above, it will be apparent to those skilled in the art that modifications and variations could be made without departing from the spirit and scope of the present disclosure as defined by the appended claims.

What is claimed is:

1. A vibration generating apparatus comprising:
an elastic member having both end portions thereof fixedly installed on a support part of a lower case;
a piezoelectric element installed on one surface of the elastic member; and
a mass body part disposed above the piezoelectric element to increase an amount of vibrations of the elastic member,
wherein the mass body part is provided with protrusion portions for first contacting the lower case at the time of an external impact,
wherein the mass body part comprises:
a mass body case connected to the piezoelectric element through an adhesive member, the adhesive member being formed of a soft material; and
a mass body installed in the mass body case, and
wherein the protrusion portions are provided on the mass body case.

2. The vibration generating apparatus of claim 1, wherein the protrusion portions are extended downwardly from both side surfaces of the mass body case, respectively, and are disposed at a central portion of the mass body case in a length direction thereof.

3. The vibration generating apparatus of claim 1, wherein the protrusion portions are extended downwardly from both side surfaces of the mass body case, respectively, and are disposed so as to be provided adjacently to both end portions thereof of the mass body case in a length direction thereof, respectively.

4. The vibration generating apparatus of claim 2, wherein distal ends of the protrusion portions are disposed below a damper member installed on a lower surface of the elastic member.

5. The vibration generating apparatus of claim 1, wherein the adhesive member is formed of tape containing a rubber component.

6. The vibration generating apparatus of claim 1, wherein the protrusion portion has a polygonal shape when viewed from a front.

7. The vibration generating apparatus of claim 1, wherein the protrusion portions include first and second protrusions disposed so as to be spaced apart from a center line of the mass body case by a predetermined interval and third and fourth protrusions disposed so as to be spaced apart from the first and second protrusions, respectively, in a length direction.

8. The vibration generating apparatus of claim 7, wherein the third and fourth protrusions are disposed at both end portions thereof of the mass body case, respectively.

9. The vibration generating apparatus of claim 7, wherein the first and second protrusions have sizes larger than those of the third and fourth protrusions.

10. The vibration generating apparatus of claim 7, wherein the mass body case is provided with a groove into which the piezoelectric element is inserted.

11. The vibration generating apparatus of claim 1, wherein the mass body case is provided with bonding protrusions for increasing coupling force between the mass body case and the mass body, and the mass body is provided with bonding grooves into which the bonding protrusions are inserted.

12. A vibration generating apparatus comprising:
an elastic member having both end portions thereof fixedly installed on a support part of a lower case;
a piezoelectric element installed on one surface of the elastic member;
a mass body case connected to the piezoelectric element through an adhesive member, wherein the adhesive member is formed of a soft material; and
a mass body installed in the mass body case to increase an amount of vibrations of the elastic member,
wherein the mass body case is provided with protrusion portions extended downwardly from both side surfaces of the mass body case, respectively.

13. The vibration generating apparatus of claim 7, wherein distal ends of the protrusion portions are disposed below a damper member installed on a lower surface of the elastic member.

* * * * *